(12) United States Patent
Huang et al.

(10) Patent No.: US 11,561,095 B2
(45) Date of Patent: Jan. 24, 2023

(54) HIGH QUALITY FACTOR MEMS SILICON FLOWER-OF-LIFE VIBRATORY GYROSCOPE

(71) Applicant: HRL Laboratories, LLC, Malibu, CA (US)

(72) Inventors: Lian X. Huang, Thousand Oaks, CA (US); Logan Sorenson, Thousand Oaks, CA (US); Raviv Perahia, Calabasas, CA (US); Hung Nguyen, Los Angeles, CA (US); David T. Chang, Calabasas, CA (US)

(73) Assignee: HRL LABORATORIES, LLC, Malibu, CA (US)

(*) Notice: Subject to any disclaimer, the term of this patent is extended or adjusted under 35 U.S.C. 154(b) by 368 days.

(21) Appl. No.: 16/847,248

(22) Filed: Apr. 13, 2020

(65) Prior Publication Data
US 2020/0256676 A1    Aug. 13, 2020

Related U.S. Application Data (62) Division of application No. 16/003,010, filed on Jun. 7, 2018, now Pat. No. 10,655,964.

(60) Provisional application No. 62/542,744, filed on Aug. 8, 2017.

(51) Int. Cl.
*B81C 1/00* (2006.01)
*H01L 41/00* (2013.01)
*G01C 19/5712* (2012.01)
*G01C 19/5684* (2012.01)
*G01C 19/5677* (2012.01)

(52) U.S. Cl.
CPC ...... *G01C 19/5712* (2013.01); *B81C 1/00015* (2013.01); *G01C 19/5677* (2013.01); *G01C 19/5684* (2013.01); *H01L 41/00* (2013.01)

(58) Field of Classification Search
None
See application file for complete search history.

(56) References Cited

U.S. PATENT DOCUMENTS

| | | | |
|---|---|---|---|
| 5,450,751 A | 9/1995 | Putty et al. | |
| 5,831,162 A * | 11/1998 | Sparks | G01P 15/0802 73/504.12 |
| 5,915,276 A | 6/1999 | Fell | |
| 6,089,090 A | 7/2000 | Namerikawa et al. | |
| 6,128,954 A | 10/2000 | Jiang | |
| 6,151,964 A | 11/2000 | Nakajima | |
| 6,343,509 B1 | 2/2002 | Fell et al. | |
| 6,481,285 B1 | 11/2002 | Shkel | |
| 6,534,396 B1 * | 3/2003 | Fahn | H01L 21/76801 438/646 |

(Continued)

FOREIGN PATENT DOCUMENTS

| | | |
|---|---|---|
| CN | 106289215 A | 1/2017 |
| KR | 20100103306 A | 9/2010 |

OTHER PUBLICATIONS

Partial Supplementary European Search Report from EP app. No. 1884528.0, dated Feb. 26, 2021.

(Continued)

*Primary Examiner* — Jay C Chang
(74) *Attorney, Agent, or Firm* — Ladas & Parry, LLP (57) ABSTRACT

A resonator includes an anchor, an outer stiffener ring on an outer perimeter of the resonator, and a plurality of curved springs between the anchor and the outer stiffener ring.

13 Claims, 9 Drawing Sheets

(56) References Cited

U.S. PATENT DOCUMENTS

| | | |
|---|---|---|
| 6,889,550 B2 | 5/2005 | Beitia |
| 6,944,931 B2 | 9/2005 | Shcheglov |
| 7,040,163 B2 | 5/2006 | Shcheglov et al. |
| 7,123,111 B2 | 10/2006 | Bninson |
| 7,581,443 B2 | 9/2009 | Kubena |
| 10,655,964 B2 | 5/2020 | Huang |
| 2004/0118204 A1 | 6/2004 | Fell |
| 2005/0172715 A1 | 8/2005 | Babala |
| 2008/0148846 A1 | 6/2008 | Whelan |
| 2009/0064782 A1 | 3/2009 | Yazdi |
| 2010/0071465 A1 | 3/2010 | Stewart |
| 2013/0167639 A1 | 7/2013 | Kuang |
| 2014/0224016 A1 | 8/2014 | Leclerc |
| 2016/0118955 A1* | 4/2016 | Hsu ................... H03H 9/02338 333/186 |
| 2016/0153779 A1 | 6/2016 | Vohra et al. |

OTHER PUBLICATIONS

Supplementary European Search Report from EP app. No. 18845128.0, dated May 31, 2021.

From U.S. Appl. No. 16/003,010 (now U.S. Pat. No. 10,655,964), Notice of Allowance dated Jan. 15, 2020.

From U.S. Appl. No. 16/003,010 (now U.S. Pat. No. 10,655,964), Sep. 10, 2019.

From U.S. Appl. No. 16/003,010 (now U.S. Pat. No. 10,655,964), Aug. 5, 2019.

PCT International Search Report and Written Opinion from PCT/US2018/036564 dated Sep. 27, 2018.

PCT International Preliminary Report on Patentability (Chapter II) from PCT/US2018/036564 dated Aug. 12, 2019.

\* cited by examiner

FIG. 7C (c) Inverse Sun Burst

FIG. 7F (f) Wide Outset Ring Width of (c)

FIG. 7B (b) Sun Burst

FIG. 7E (e) Wide Outset Ring Width of (b)

FIG. 7A (a) FVG w/o Inner Stiffener

FIG. 7D (d) Wide Outset Ring Width of (a)

HIGH QUALITY FACTOR MEMS SILICON FLOWER-OF-LIFE VIBRATORY GYROSCOPE

CROSS-REFERENCE TO RELATED APPLICATIONS

This application is a divisional of U.S. patent application Ser. No. 16/003,010, filed Jul. 6, 2018, which relates to and claims the benefit of priority from U.S. Provisional Patent Application 62/542,744, filed Aug. 8, 2017, which are incorporated herein by reference as though set forth in full.

STATEMENT REGARDING FEDERAL FUNDING

None.

TECHNICAL FIELD

This disclosure relates to resonators and gyroscopes, and in particular vibratory gyroscopes.

BACKGROUND

Prior art vibratory gyroscopes include silicon disk resonator gyroscopes (DRGs), and example prior art silicon DRGs are described in U.S. Pat. No. 6,944,931B2, issued Sep. 20, 2005 and U.S. Pat. No. 7,040,163B2, issued May 9, 2006, which are incorporated herein by reference. These prior art silicon DRGs may have resonance frequencies of around 14 kHz and Q-factors of around 80,000. DRGs are sensitive to vibration, shock, and temperature. Also due to their natural frequency, silicon DRGs do not operate well under harsh vibration and thermal conditions. To reduce these vibration, shock, and temperature effects, prior art DRGs require an undesirable size, weight and volume to provide some mitigation.

What is needed is an improved vibratory gyroscope that has an attractive CSWaP (Cost Size Weight and Power), a higher resonance frequency and a higher Q-factor and which is less sensitive to vibration, shock, and temperature. The embodiments of the present disclosure answer these and other needs.

SUMMARY

In a first embodiment disclosed herein, a resonator comprises an anchor, an outer stiffener ring on an outer perimeter of the resonator, and a plurality of curved springs between the anchor and the outer stiffener ring.

In one aspect the outer stiffener ring has a first diameter and the anchor is concentric with the outer stiffener ring and has a second diameter less than the first diameter.

In another aspect the resonator further comprises at least one inner stiffener ring concentric with the outer stiffener ring, wherein the plurality of curved springs are coupled to the at least one inner stiffener ring, and wherein the outer stiffener ring has a first diameter that is greater than a second diameter of the inner stiffener ring.

In yet another aspect the plurality of curved springs comprise a first set of springs each having a clockwise curvature between the anchor and the outer stiffener ring, and a second set of curved springs each having a counter-clockwise curvature between the anchor and the outer stiffener ring.

In still another aspect the plurality of curved springs comprise a first set of curved springs each having a convex curvature between the anchor and the outer stiffener ring, and a second set of curved springs each having a concave curvature between the anchor and the outer stiffener ring, and the plurality of curved springs are arranged between the anchor and the outer stiffener ring such that a respective spring having a convex curvature intersects a respective spring having a concave curvature at a same location on the inner stiffener.

In another aspect the outer stiffener ring has a diameter ranging from 1 to 20 millimeters, the anchor has a diameter ranging from 0.1-10 millimeters, the outer stiffener ring has a width ranging from 1-500 micrometers, the plurality of springs have a width ranging from 1-500 micrometers, and the resonator has a thickness ranging from 10-500 micrometers.

In another aspect the outer stiffener ring has an aspect ratio ranging from 1:500 to 50:1, wherein the aspect ratio is the ratio of the width to the thickness of the outer stiffener ring, the plurality of curved springs with an aspect ratio ranging from 1:500 to 50:1, wherein the aspect ratio is the ratio of the width to the thickness of the springs.

In another aspect the plurality of curved springs have a rotational symmetry about a center axis with an N fold of symmetry, where N is a positive integer.

In another aspect, the resonator comprises a plurality of inner stiffener rings each concentric with the outer stiffener ring, wherein a pitch between each adjacent inner stiffener ring, or between the outer stiffener ring and a respective inner stiffener ring adjacent to the outer stiffener ring, or between the anchor and a respective inner stiffener ring adjacent to the anchor is the same.

In another aspect, the resonator comprises a plurality of electrodes outside the outer perimeter of the resonator, wherein the plurality of electrodes are not in physical contact with the outer stiffener ring, and wherein a gap is between each electrode and the outer stiffener ring.

In another aspect, the gap is filled with a gas or a vacuum.

In another aspect, the resonator comprises a plurality of internal electrodes, wherein each internal electrode is located between a curved spring and another curved spring and the at least one inner stiffener ring, or between a curved spring and another curved and the anchor, or between a curved spring and another curved and the outer stiffener ring, wherein the plurality of inner electrodes are not in physical contact with the curved springs, the inner stiffener ring, the anchor or the outer stiffener ring, and wherein a gap is between each inner electrode and adjacent curved springs, the at least one inner stiffener ring, the anchor and the outer stiffener ring.

In another aspect, the resonator has a thermoelastic damping limited quality factor (QTED) greater than 150,000.

In another aspect, the resonator has a resonance frequency greater than 30 kHz.

In another aspect, the resonator comprises silicon-on-insulator (SOI).

In another aspect, the resonator comprises silicon, quartz, or SiC.

In another aspect, a thermoelastic damping limited quality factor (QTED) and a resonance frequency of the resonator increases with increasing width of the curved springs.

In another aspect, the outer stiffener ring has a width greater than a width of each of the curved springs.

In another aspect, the plurality of curved springs comprise a plurality of convex springs coupled to the outer stiffener ring and pointing towards the anchor.

In another aspect, the plurality of curved springs comprise a plurality of convex springs coupled to the anchor and pointing towards the outer stiffener ring.

In another embodiment disclosed herein, a resonator comprises an anchor, an outer stiffener ring on an outer perimeter of the resonator, and a plurality of curved springs organized in a flower-of-life pattern.

In one aspect, the flower-of-life pattern is configured by overlapped curved springs that form outlines of leaf shapes, wherein the outlines of the leaf shapes formed include but not limited to linear, elliptical, oval, ovate, deltoid, cordate, oblong, rhomboid, obovate, oblanceolate, orbicular, lanceolate, reniform, spathulate outlines, or combinations thereof, wherein the outline of leaf shapes formed are symmetric and symmetrically arranged around the anchor, wherein the flower-of-life pattern has a rotational symmetry about a center axis with N fold of symmetry, where N is a positive integer.

In another embodiment disclosed herein, a method of providing a resonator comprises providing a silicon-on-insulator (SOI) wafer comprising an insulator with backside silicon on one side of the insulator and front side silicon on another side of the insulator, patterning a front side alignment target on the front side silicon, depositing and patterning front side metal on the front side silicon, patterning the front side silicon using deep reactive ion etching to expose the insulator and to form an anchor, an outer stiffener ring on an outer perimeter of the resonator, and a plurality of curved springs coupled between the anchor and the outer stiffener ring, removing a portion of the insulator by using an etchant to undercut and release a resonant portion of the resonator from the backside silicon, and leaving an anchor portion of the resonator attached to the backside silicon. Patterning can be a form of etching or depositing.

In one aspect the method further comprises patterning a backside alignment target on the backside silicon, and depositing and patterning backside metal on the backside silicon for attachment to a package. Patterning can be a form of etching or depositing.

In another aspect depositing and patterning front side metal on the front side silicon comprises depositing metal for electrical contact to an electrode and for electrical contact to the anchor.

In another aspect the insulator is silicon dioxide (SiO$_2$), and the etchant is hydrofluoric acid (HF).

In another aspect the outer stiffener ring has a first diameter, and the anchor is concentric with the outer stiffener ring and has a second diameter less than the first diameter.

In another aspect patterning the front side silicon using deep reactive ion etching further comprises patterning to form at least one inner stiffener ring concentric with the outer stiffener ring, wherein the plurality of curved springs are coupled to the at least one inner stiffener ring, and wherein the outer stiffener ring has a first diameter that is greater than a second diameter of the inner stiffener ring. Wherein patterning can be a form of etching or depositing.

In another aspect the plurality of curved springs comprise a first set of springs each having a clockwise curvature between the anchor and the outer stiffener ring, and a second set of curved springs each having a counter-clockwise curvature between the anchor and the outer stiffener ring.

In another aspect the plurality of curved springs comprise a first set of curved springs each having a convex curvature between the anchor and the outer stiffener ring, and a second set of curved springs each having a concave curvature between the anchor and the outer stiffener ring; and the plurality of curved springs are arranged between the anchor and the outer stiffener ring such that a respective spring having a convex curvature intersects a respective spring having a concave curvature at a same location on the inner stiffener.

In another aspect the outer stiffener ring has a diameter ranging from 1 to 20 millimeters, the anchor has a diameter ranging from 0.1-10 millimeters, the outer stiffener ring has a width ranging from 1-500 micrometers, and the resonator has a thickness ranging from 10-500 micrometers.

In another aspect the plurality of curved springs have a rotational symmetry about a center axis with an N fold of symmetry, where N is a positive integer.

In another aspect the method further comprises patterning a plurality of inner stiffener rings each concentric with the outer stiffener ring, wherein a pitch between each adjacent inner stiffener ring, or between the outer stiffener ring and a respective inner stiffener ring adjacent to the outer stiffener ring, or between the anchor and a respective inner stiffener ring adjacent to the anchor is the same. Patterning can be a form of etching or depositing.

In another aspect the method further comprises forming a plurality of electrodes outside the outer perimeter of the resonator, wherein the plurality of electrodes are not in physical contact with the outer stiffener ring, and wherein a gap is between each electrode and the outer stiffener ring.

In another aspect the gap is filled with a gas or a vacuum.

In another aspect the method further comprises forming a plurality of internal electrodes, wherein each internal electrode is located between a curved spring and another curved and the at least one inner stiffener ring, or between a curved spring and another curved and the anchor, or between a curved spring and another curved and the outer stiffener ring, wherein the plurality of inner electrodes are not in physical contact with the curved springs, the inner stiffener ring, the anchor or the outer stiffener ring, and wherein a gap is between each inner electrode and adjacent curved springs, the at least one inner stiffener ring, the anchor and the outer stiffener ring.

In another aspect the outer stiffener ring has a width greater than a width of each of the curved springs.

In another aspect the plurality of curved springs comprise a plurality of convex springs coupled to the outer stiffener ring and pointing towards the anchor.

In another aspect the plurality of curved springs comprise a plurality of convex springs coupled to the anchor and pointing towards the outer stiffener ring.

In another embodiment disclosed herein, a method of providing a resonator comprises providing a wafer comprising an insulator with backside wafer on one side of the insulator and front side wafer on another side of the insulator, depositing and patterning front side metal on the front side wafer, patterning the front side wafer to expose the insulator and to form an anchor, an outer stiffener ring on an outer perimeter of the resonator, and a plurality of curved springs between the anchor and the outer stiffener ring, removing a portion of the insulator to release a resonant portion of the resonator from the backside wafer, and leaving an anchor portion of the resonator attached to the backside wafer.

In one aspect the frontside wafer comprises Si, quartz, or SiC, and the backside wafer comprises Si, quartz, or SiC.

These and other features and advantages will become further apparent from the detailed description and accompanying figures that follow. In the figures and description,

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

The present disclosure describes a high-Q (Quality Factor) Micro-Electro-Mechanical Systems (MEMS) silicon Flower-of-life Vibratory Gyroscope (FVG) resonator. In the following, reference to an FVG includes the FVG resonator.

Due to its symmetry, the FVG structure has a family of frequency-matched {cos/sin}(N*theta) vibration modes, where theta is the circumferential direction around the perimeter of the device and N is the mode number. N=1, N=2, N=3, N=4, etc. are mode numbers of interest for gyroscope applications, and N=2 is typical mode for a gyroscope application. These types of modes are ideal for a symmetric Coriolis vibratory gyroscope, because the Coriolis effect can efficiently transfer energy between a frequency-matched N-mode pair during rotation, providing a means to sense rotation. Further, the symmetry of the FVG structure means that, except for the N=1 mode, the centers of mass of the vibratory modes remain at the center of the structure and they inherently reject acceleration. This is important since it is desirable to sense rotation rather than other effects such as acceleration.

The FVG resonator design allows deformation of its structure without twisting to reduce strain-induced thermal gradients, resulting in a high thermoelastic damping limited quality factor (QTED). The QTED for the FVG may be greater than 150,000. If the FVG resonator includes cross-linked FVG springs, the effective stiffness of the FVG is enhanced while the mass is reduced compared to the prior art disk resonator gyroscopes (DRGs). With cross-linked FVG springs, a high N=2 mode resonance frequency of greater than 30 kHz can be achieved, which is more than twice the typical vibration frequencies of similar QTED silicon gyro structures, such as disk resonator gyroscopes (DRGs). Higher resonance frequency allows the gyroscope to operate without being affected by typical vibration environments encountered in many applications, which are typically less than 10 kHz. In addition, FVGs with thicknesses of 350 um (micrometers) or more may have reduced acceleration sensitivity, up to 50,000 Gs in any acceleration direction, compared to the prior art. The FVG design has a much higher electrostatic frequency tuning range due to a lower mass compared to prior art silicon gyro designs, which has the benefit of cancelling frequency splits caused by fabrication defects, vibration, and thermal effects. In addition, a frequency tuning range can be achieved for the FVG through dynamic electrical means rather than static mechanical trimming. Further, by increasing the ring width for the whole structure, the FVG design may have a high adiabatic QTED since a wider ring width of greater than 100 um has a resonance frequency greater than 100 kHz. The FVG provides a high-Q silicon vibratory gyroscope and resonator structure in frequency ranges previously not thought to be possible.

One object of the present disclosure is to enable the design of high-Q Micro-Electro-Mechanical Systems (MEMS) silicon Coriolis vibratory gyroscopes (CVGs). Prior art CVGs include silicon disk resonator gyroscopes (DRGs) with resonance frequencies around 14 kHz and Q-factors of around 80,000. Due to their natural resonance frequency of around 14 kHz, Si-DRGs may not operate well under harsh vibration and thermal conditions. The lower bound of the FVG resonance frequency is near 35 kHz, which is more than double that of the typical DRG vibration frequency, so the FVG performance is not affected by typical vibrations. Prior art DRGs need vibration and thermal isolation mechanisms to achieve same bias stability. Also, the FVG may have a 155,000 Q-factor, which is 2 to 2.5 time that obtained by prior art DRGs. The upper bound of a FVG Q-factor may only be limited by thermoelastic dissipation (TED). The FVGs of the present disclosure are significantly less sensitive to vibration and shock, and their tuning capability means that they can be tuned to accommodate any temperature induced drift.

Figure 1A:
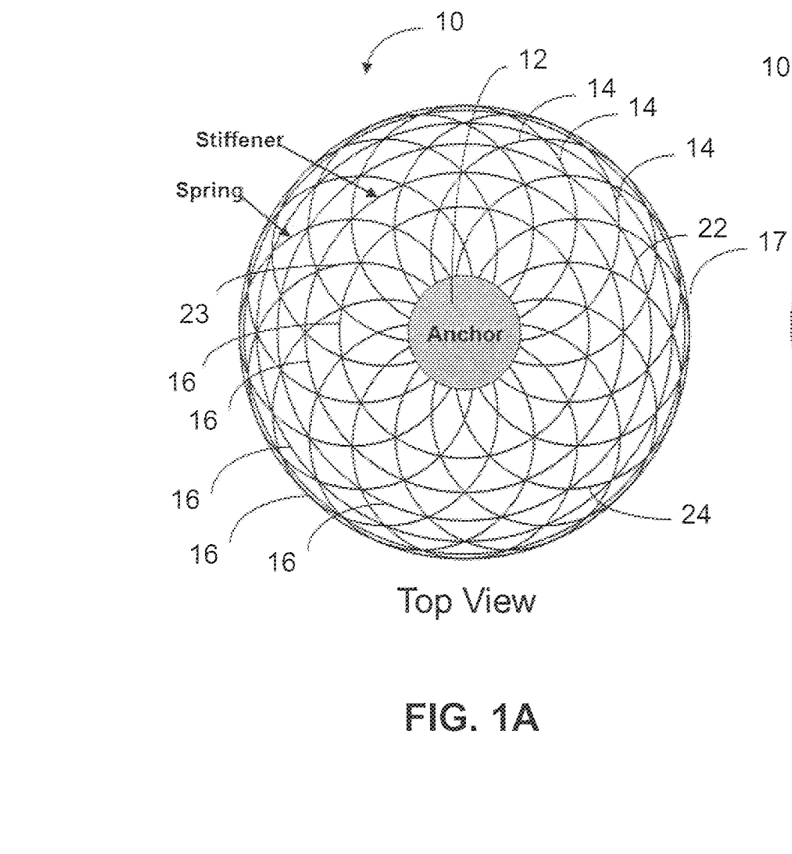
FIGS. 1A and 1B show a top and a tilted view, respectively, of a Flower-of-life Vibratory Gyroscope (FVG) resonator design in accordance with the present disclosure.
Figure 1B:
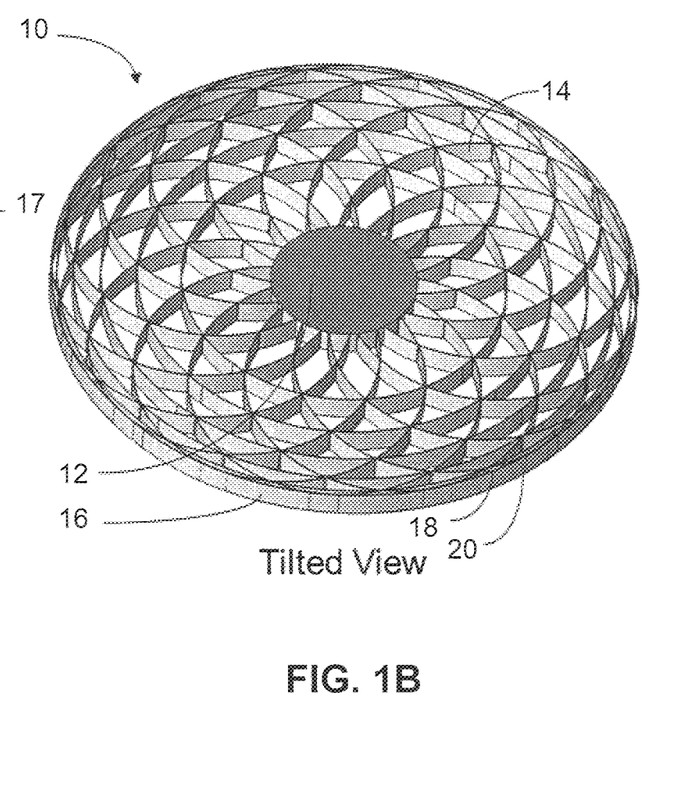

The MEMS Flower-of-life Vibratory Gyroscope (FVG) is so called due to its geometry, as shown, for example in FIGS. 1A and 1B. The FVG has a high thermal elastic damping quality factor (QTED) and a high anchor quality factor (Qanchor), low acceleration sensitivity, a high frequency tuning range and higher resonance frequency than prior art DRGs that have typical resonance frequencies of only about 10-15 kHz.

The Flower-of-life Vibratory Gyroscope (FVG) is socalled due to the curved springs formed in the geometric flower-of-life pattern. The pattern is produced by the overlapped curved springs that form the outline of common leaf shapes. The common leaf shapes include but not limited to linear, elliptical, oval, ovate, deltoid, cordate, oblong, rhomboid, obovate, oblanceolate, orbicular, lanceolate, reniform, spathulate, or combinations thereof. The leaf shapes must be symmetrical and symmetrically arranged around the anchor. The radial balance of the plurality of curved springs provide rotational symmetry about a center axis with N fold symmetry, where N is a positive integer.

Figure 9:
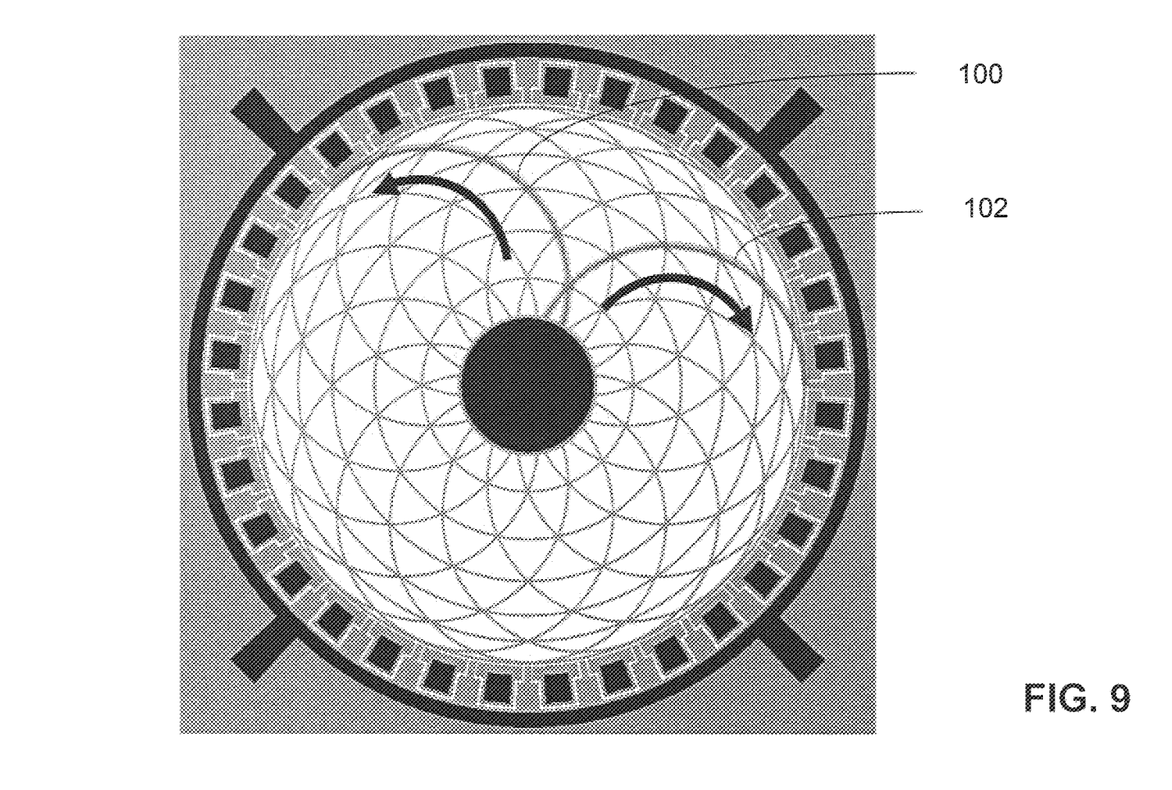
FIG. 9 shows a FVG resonator design illustrating clockwise and counter-clockwise springs in accordance with the present disclosure.

The FVG resonator 10 shown in FIG. 1A has an anchor 12, springs 14 and stiffener rings 16. The anchor 12 is a solid cylinder at the center of the gyro 10. A silicon FVG resonator design may have an 8 mm outer diameter and a 2 mm anchor diameter, although the outer diameter and anchor may have other dimensions. In FIG. 1A, 6 sets of stiffener rings 16 are shown, including the outer perimeter 17, each having a ring width of 10 um and a thickness of 350 um and an aspect ratio of 1:35, where the aspect ratio is the ratio of the width to the thickness. The thickness of the stiffener rings 16 is best understood as the distance between a top 18 of the FVG and a bottom 20 of the FVG, as shown in the tilted view in FIG. 1B, and also shown in FIG. 5D. The thickness of the FVG 10, including the springs 14, may be the same as the thickness of the stiffener rings 16. The ring width is the dimension of the stiffener ring 16 orthogonal to the thickness dimension. The springs 14 are connected to the anchor 12 and to each stiffener ring 16 including the stiffener ring 16 on the outer perimeter 17. The springs 14 are curved. In the FVG of FIGS. 1A and 1B, there are sixteen pairs of springs 14. Each pair of springs 14, such as the pair of springs 22 and 24, are in the form of a circle, which has its circumference not entirely closed because of the intersection of springs 14 with the anchor 12. Each pair of springs 14 includes a spring 22 having a convex curvature, and a spring 24 having a concave curvature. Alternatively, the FVG may be described as having pairs of springs, such as the pair of springs 22 and 23, shown in FIG. 1A, having a clockwise curvature 102 and having a counter-clockwise curvature 100, respectively, as shown in FIG. 9. Each such pair of springs in FIGS. 4A, 4B, 7A and 7D also may be described as a spring 102 having a clockwise curvature 102, which follows a path originating at the anchor and curving in a clockwise direction toward the outer ring 17, and a spring 100 having a counter-clockwise curvature 100, which follows a path originating at the anchor and curving in a counter-clockwise direction toward the outer ring 17, as shown in FIG. 9.

If inner stiffener rings 16 are included between the stiffener ring on the outer perimeter 17 (the outer stiffener ring) and the anchor 12, then the curved springs 14 are arranged between the anchor 12 and the outer stiffener ring 17 such that a respective spring 14 having a convex curvature intersects a respective spring 14 having a concave curvature and respective inner stiffener ring 16 at a same location on the respective inner stiffener ring 16.

The number of pairs of springs 14 may be any number and the spacing between the pairs of springs 14 may vary from that shown in FIGS. 1A and 1B. The springs 14 shown in FIGS. 1A and 1B have a rotational symmetry about a center axis with an 8 times N fold of symmetry, where N is a positive integer. The springs 14 may have an aspect ratio ranging from 1:500 to 50:1, where the aspect ratio is the ratio of the width to the thickness.

The diameter of the outer perimeter 17 of the FVG may range from 1-20 millimeters (mm), the anchor 12 diameter may range from 0.1-10 mm, the stiffener ring 16 width may range from 1-500 micrometers (um), and the device thickness, which is the same as the stiffener ring 16 thickness may range from 10-500 um. The aspect ratio of the stiffener ring 16 may be from 1:500 to 50:1, where the aspect ratio is the ratio of the width to the thickness. The number of stiffener rings 16 can be 1-20. In the case of only one stiffener ring 16, the stiffener ring 16 would preferably be on the outer perimeter 17 of the FVG resonator 10. The rotational symmetry of the FVG may be any positive integer (e.g., 1, 2, 3, . . . etc.).

The stiffener rings 16 are concentric with another and concentric with the anchor 12. The stiffener rings 16 may be located so that the stiffener rings 16 intersect the springs 14 at locations where one spring 14 intersects another spring 14, to stiffen the springs. Spring stiffeners or stiffener rings 16 are important for gyro performance at low frequency (<50 kHz) since the stiffener rings 16 increase the stiffness of the gyro structure with only a slight increment of mass, resulting in a high resonance frequency and a high frequency tuning range. Increasing the number of stiffener rings 16 can reduce anchor and TED loss. The location of each stiffener is preferably chosen to minimize any extra intersections for heat loss.

The FVG resonator design is such that all the springs 14 and stiffeners 16 are joined seamlessly, unlike prior art DRGs that may have a "dog-bone" shape as a connector between rings, as shown in FIG. 1A of U.S. Pat. No. 7,581,443, issued Sep. 1, 2009. The prior art DRG dog-bone connectors prevent the rings of the DRG from deforming freely into an N2 elliptical mode shape. Therefore prior art DRG rings twist during resonance, and twisting of the DRG rings generates hot and cold spots, causing heat loss in the DRG structures. The FVG spring 14 design eliminates this problem.

Figure 2:
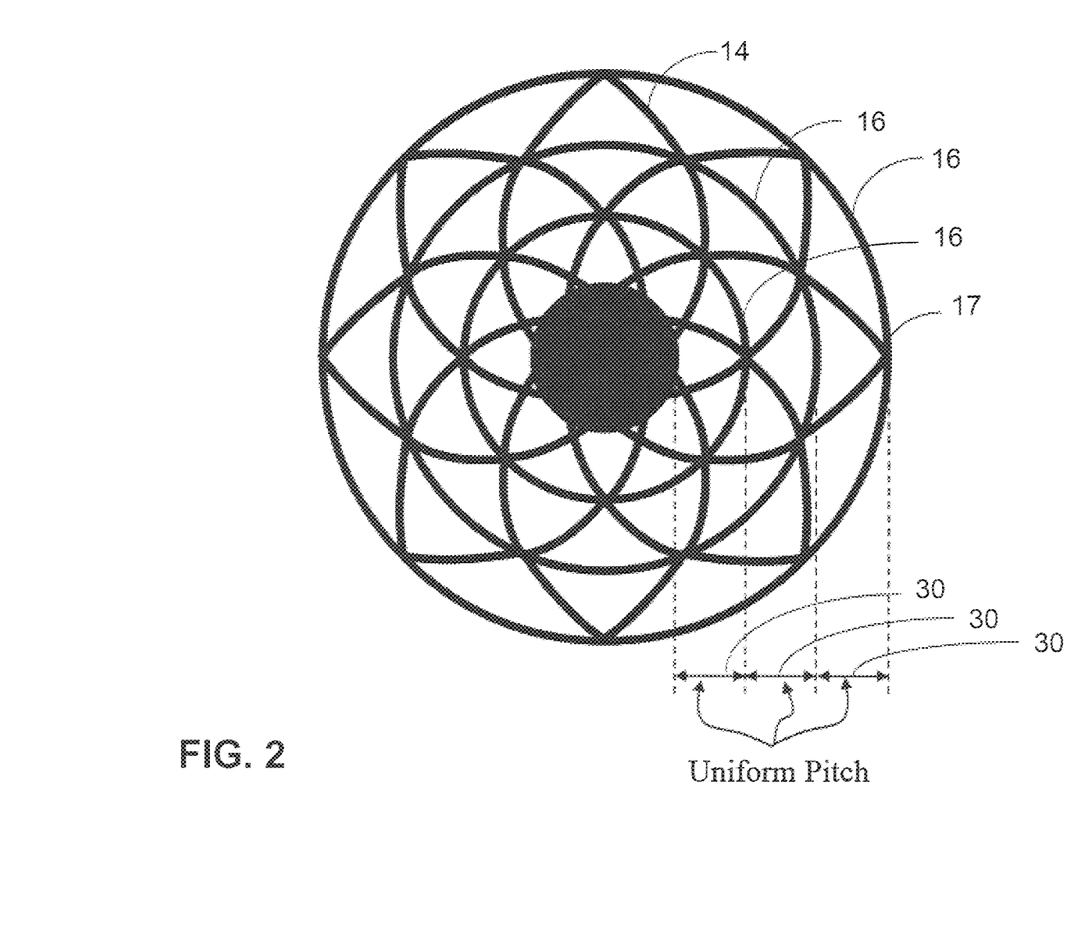
FIG. 2 shows another FVG resonator design with stiffeners having a uniform pitch or uniform increase in diameter from one stiffener to another in accordance with the present disclosure.

As shown in FIG. 2, the curvature of the springs 14 can be varied so there is a uniform pitch 30 between the concentric stiffener rings 16, which distributes mass uniformly in the radial direction. Also coupling between the anchor 12 and the FVG resonance structure can be reduced by modifying the curvature of the springs 14 so that near the anchor 12 a curved triangle formed by the intersection of the springs 14 is a wider angle rather than a narrow angle.

Figure 3A:
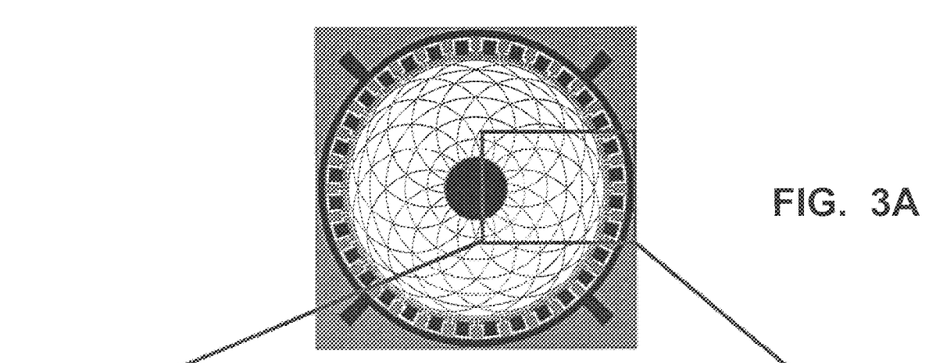
FIG. 3A shows a FVG resonator with peripheral electrodes.
Figure 3B:
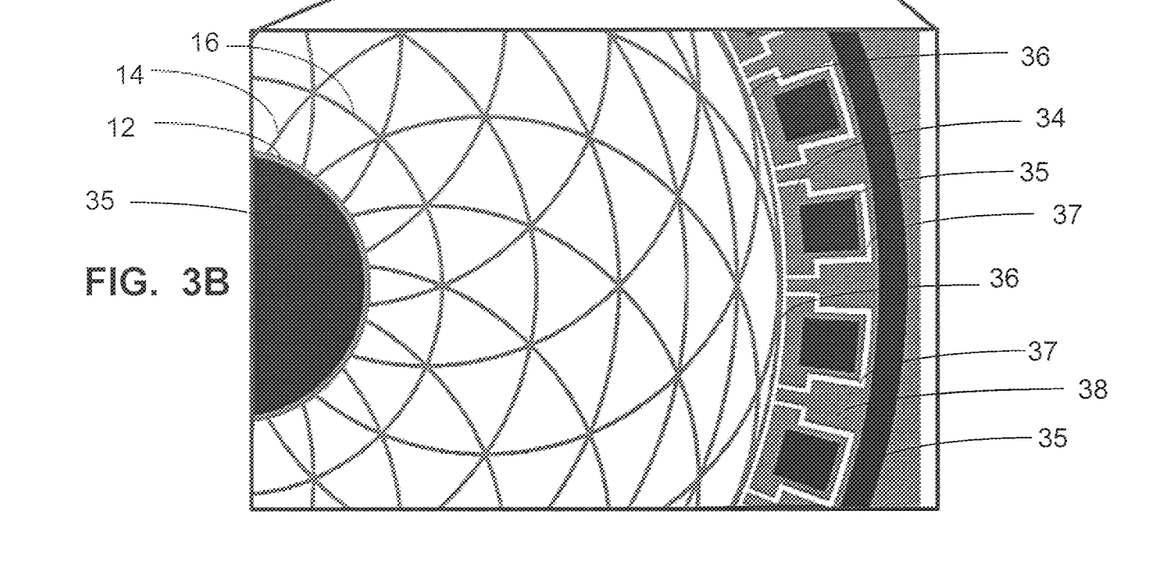
FIG. 3B shows an expanded view of a portion of FIG. 3A in accordance with the present disclosure.

FIGS. 3A and 3B, which is an expanded view of a portion of FIG. 3A, show a FVG resonator with peripheral electrodes 34. The peripheral electrodes 34 are connected to metal contacts 35 and are not in physical contact with the FVG outer diameter or the outer stiffener 16. A gap 36 is between the FVG and the peripheral electrodes 34 and may be filled with a gas, such as air, or the gap 36 may be a vacuum. An electrode set gap 37 is between the peripheral electrodes 34 and ground electrodes 38 and may be filled with a gas, such as air, or the electrode set gap 37 may be a vacuum. The dimension of the electrode set gap 37 may be greater than or equal to the gap 36.

Figure 4A:
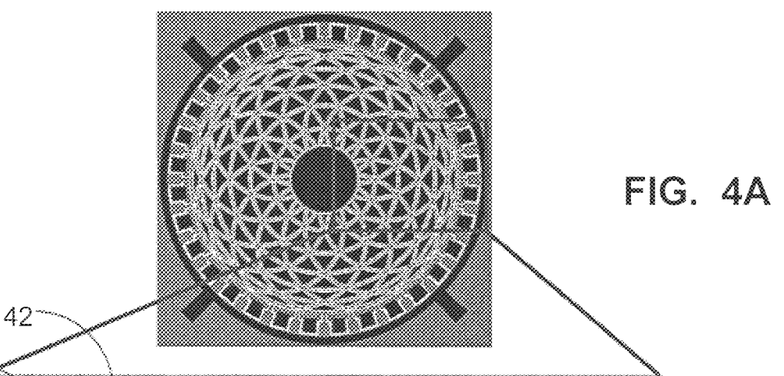
FIG. 4A shows a FVG resonator with both peripheral electrodes and internal electrodes.
Figure 4B:
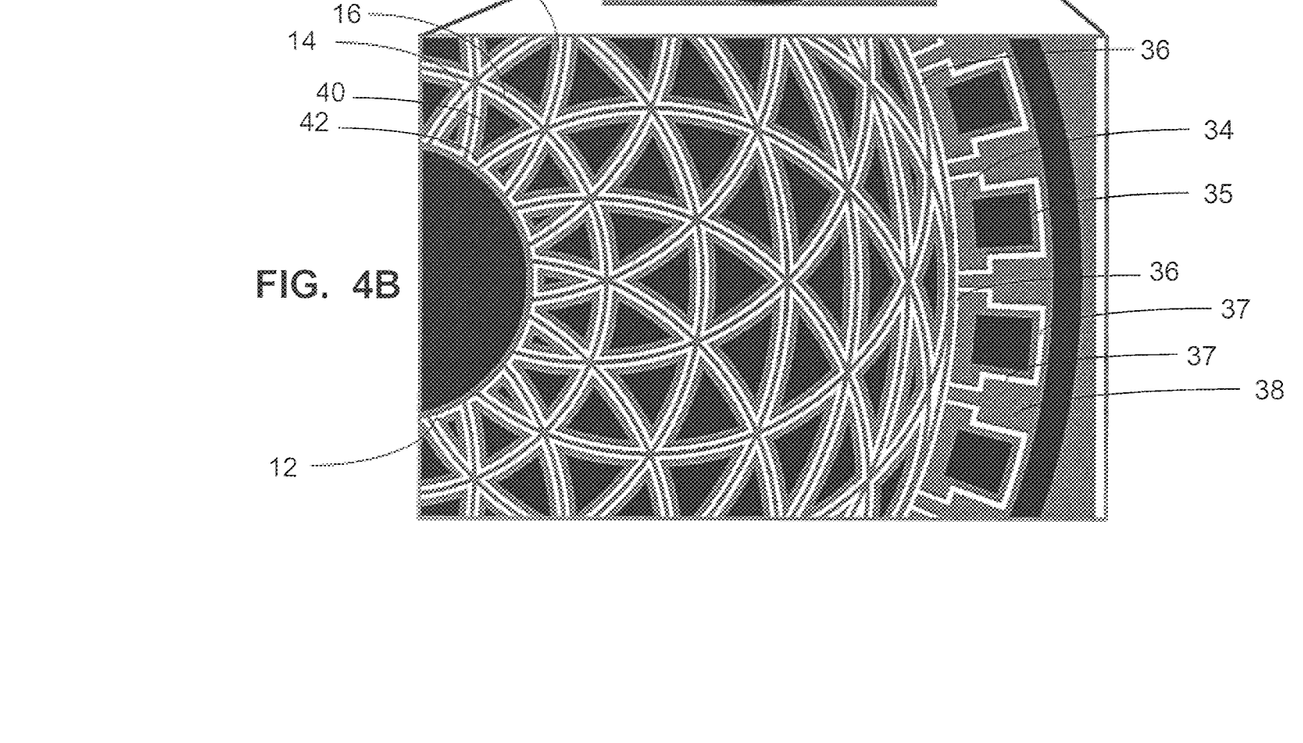
FIG. 4B shows an expanded view of a portion of FIG. 4A in accordance with the present disclosure.

FIG. 4A and FIG. 4B, which is an expanded view of a portion of FIG. 4A, show a FVG resonator with both peripheral electrodes 34 and internal electrodes 40. Similarly to the description for FIGS. 3A and 3B, the peripheral electrodes 34 are connected to metal contacts 35 and are not in physical contact with the FVG outer diameter or the outer stiffener 16, and a gap 36 is between the FVG and the peripheral electrodes 34 and may be filled with a gas, such as air, or the gap 36 may be a vacuum. An electrode set gap 37 is between the peripheral electrodes 34 and ground electrodes 38 and may be filled with a gas, such as air, or the electrode set gap 37 may be a vacuum. The dimension of the electrode set gap 37 may be greater than or equal to the gap 36. The internal electrodes 40 are in spaces between the springs 14 and the stiffener rings 16. Gaps 42 are between each internal electrode 40 and any adjacent springs 14 or stiffener ring 16. The gaps 42 may be filled with a gas, such as air, or the gaps 42 may be a vacuum.

The FVG resonator fabrication process is shown in FIGS. 5A, 5B, 5C and 5D. FIGS. 5A, 5B, 5C and 5D show a fabrication example for a silicon-on-insulator (SOI} configuration; however rather than silicon, quartz or SiC can be used. Also, the $SiO_2$ and Au shown may be any appropriate insulator or metal, respectively. It should also be understood that the etching steps may be more broadly be stated as patterning.

Figure 5A:
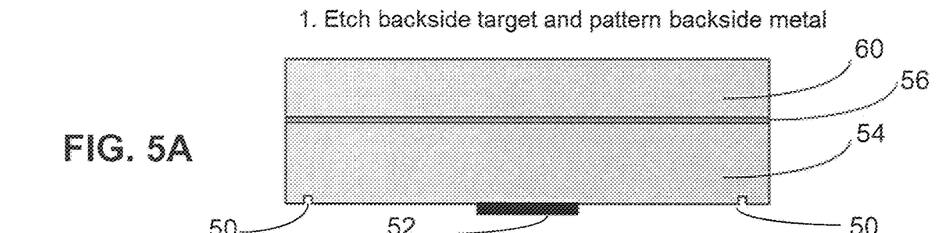
FIGS. 5A, 5B, 5C and 5D show a process flow for making a Flower-of-life Vibratory Gyroscope (FVG) resonator in accordance with the present disclosure.

First, as shown in FIG. 5A, a backside alignment target 50 is formed by patterning silicon (Si) 54 on the backside of a wafer, which may be a silicon-on-insulator (SOI) wafer. The SOI wafer has backside silicon 54, which is used as a handle, and frontside Si 60. Both the frontside Si 54 and the backside Si 60 are on insulator 56. Then backside metal 52 may be patterned and deposited. The backside metal 52 is for die attachment to a Leadless Chip Carrier (LCC) package.

Figure 5B:
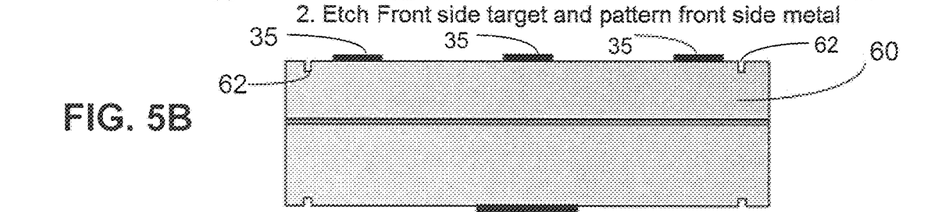

Then, as shown in FIG. 5B, a front side alignment target 62 is etched in Si 60 on the front side of the SOI wafer. Next front side metal is patterned and deposited for electrical contacts 35, some of which are coupled to the peripheral electrodes 34.

Figure 5C:
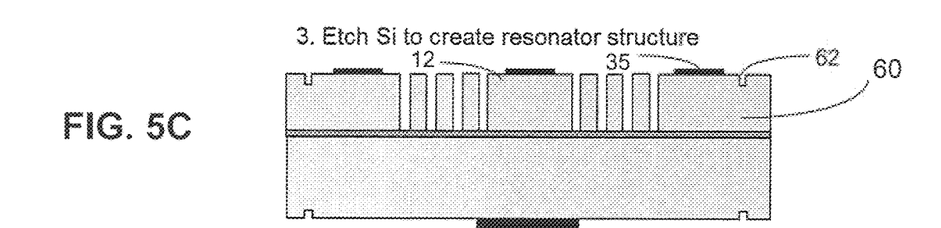

Then, as shown in FIG. 5C, the FVG resonator 10 is formed by Deep Reactive-Ion Etching (DRIE) of the frontside Si 60, and exposing the buried insulator 56, which may be silicon dioxide ($SiO_2$).

Figure 5D:
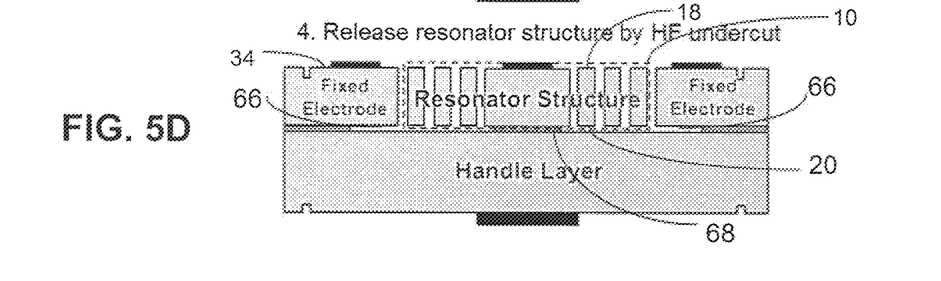

Next, as shown in FIG. 5D, a portion 66 of the buried insulator 56 is removed by using a hydrofluoric (HF) acid undercut to release the FVG structure 10 from the Si handle 54. Another portion 68 is left intact between the resonator structure 10 and the backside Si 54 of the SOI wafer to provide mechanical support.

The Flower-of-life vibratory gyroscope using the FVG resonator has better gyro performance than prior art DRGs, in terms of quality factors QTED and Qanchor and less acceleration sensitivity. The FVG not only has better performance, but also has a higher N=2 mode resonance frequency, allowing operation in harsh vibration environments.

Figure 6:
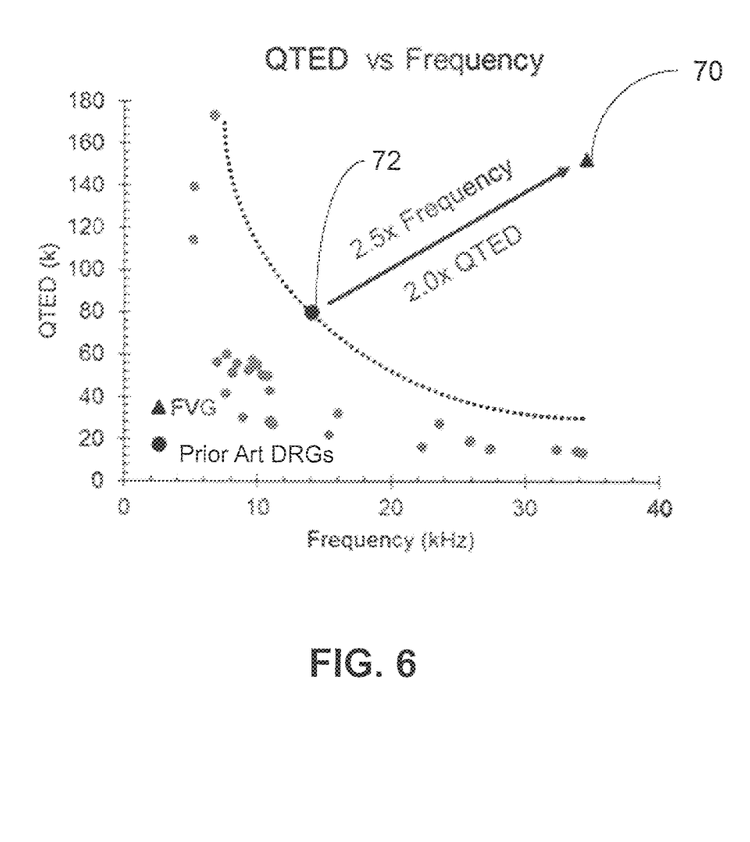
FIG. 6 shows a graph of the quality factor limited by thermo-elastic damping (QTED) and resonance frequency of the Flower-of-life Vibratory Gyroscope (FVG) compared with prior art Disk Resonator Gyroscopes (DRGs) in accordance with the present disclosure.

FIG. 6 shows that a FVG resonator may achieve a quality factor (Q) of 155,000 (1.55E5) at a frequency of 35 kHz, as shown by triangle 70. The FVG resonator is 2.5 times higher than the prior art DRGs in terms of N=2 mode resonance frequency, and 2.0 times the prior art in terms of thermoelastic damping quality (QTED). The triangle 70 marks the QTED for a FVG design having the following geometry dimensions: a 10 um stiffener ring width, a 8 mm outer diameter, a 2 mm anchor diameter, and 5 stiffener rings 16, as shown in FIGS. 1A and 1B. The circles in FIG. 6 represent prior art DRG designs with the black circle 72 marking the best to date prior art DRG design. Compared with the prior art DRGs, the FVG design enables a high Q silicon MEMS gyroscope to operate at a frequency greater than 20 kHz without compromising other performance aspects, including vibration insensitivity and electrical frequency tuning range.

Figure 7A:
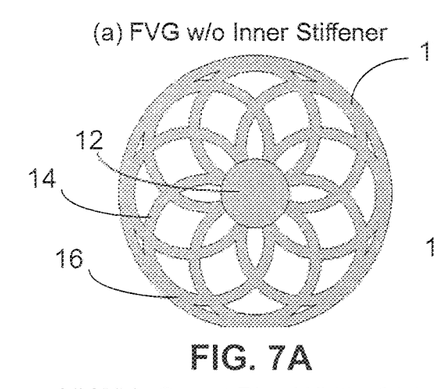
FIG. 7A shows a FVG resonator without any inner stiffener.
Figure 7B:
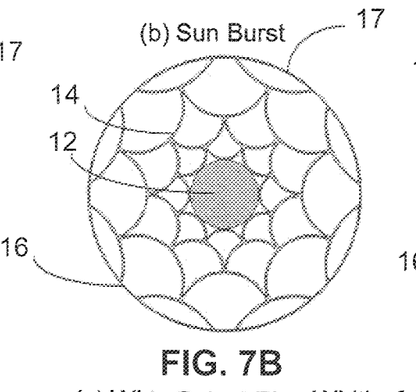
FIG. 7B shows a FVG resonator having a Sun Burst design.
Figure 7C:
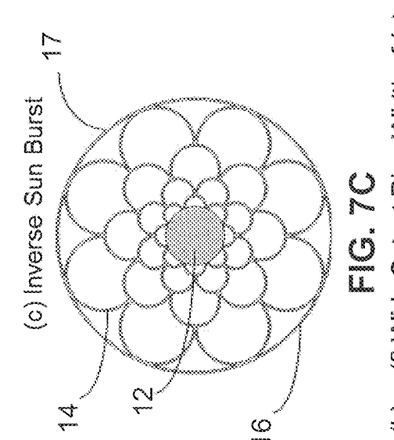
FIG. 7C shows a FVG resonator having an Inverse Sun Burst design.
Figure 7D:
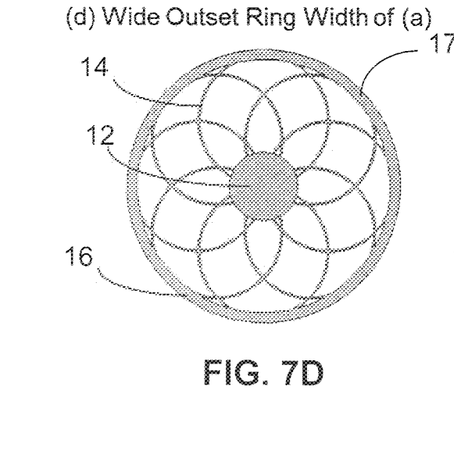
FIGS. 7D, 7E and 7F show FVG resonator designs corresponding to FIGS. 7A, 7B and 7C and having a wider outside ring in accordance with the present disclosure.
Figure 7E:
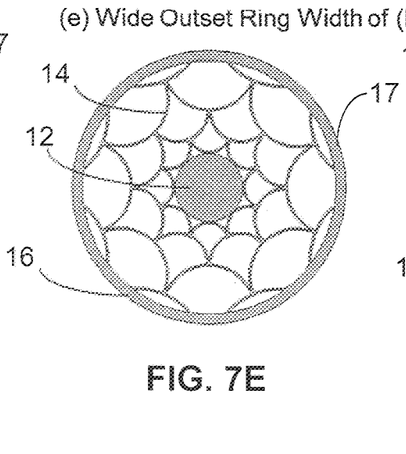
Figure 7F:
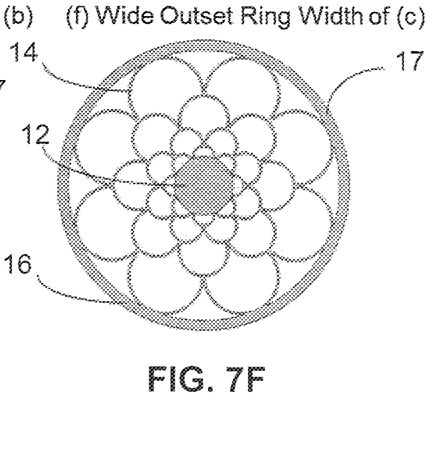

Other FVG variations are shown in FIGS. 7A to 7F. FIG. 7A shows a FVG without any stiffeners 16, except for the outer ring 16. FIG. 7B shows a FVG with a socalled sun burst spring 14 pattern between the outer ring 16 and the anchor 12, and FIG. 7C shows a FVG with a socalled inverse sun burst spring 14 pattern between the outer ring 16 and the anchor 12. The sun burst spring pattern of FIG. 7B has convex springs pointing toward the anchor 12, and the inverse sun burst spring pattern of FIG. 7C has convex springs pointing away from the anchor 12. FIGS. 7D, 7E and 7F show FVG designs that are the same as FIGS. 7A, 7B and 7C, respectively, except that the outer ring 16 on the outer perimeter 17 in FIGS. 7D, 7E and 7F has a wider ring width relative to the width of the springs 14. In FIGS. 7A, 7B and 7C the outer ring 16 and the springs 14 have the same width.

The FVG without an inner stiffener has a unit cell of a diamond shape with curve edges, as shown in FIG. 7A. Sun Burst designs and Inverse Sun burst designs have unit cells having a curved triangle shape, like a paper fan, as shown in FIGS. 7B and 7C. The dome part of each unit cell points towards the center of the resonator structure for Sun Burst designs, as shown in FIGS. 7B and 7E, but the dome part of each unit cell points away from the center of the resonator structure for Inverse Sun Burst designs, as shown in FIGS. 7C and 7F.

Ring width, stiffener ring number, radius of curvature, and inner and outer diameter are the key design parameters to understand the relationship to quality factor, acceleration sensitivity, and frequency tunability of the MEMS gyroscope.

Figure 8:
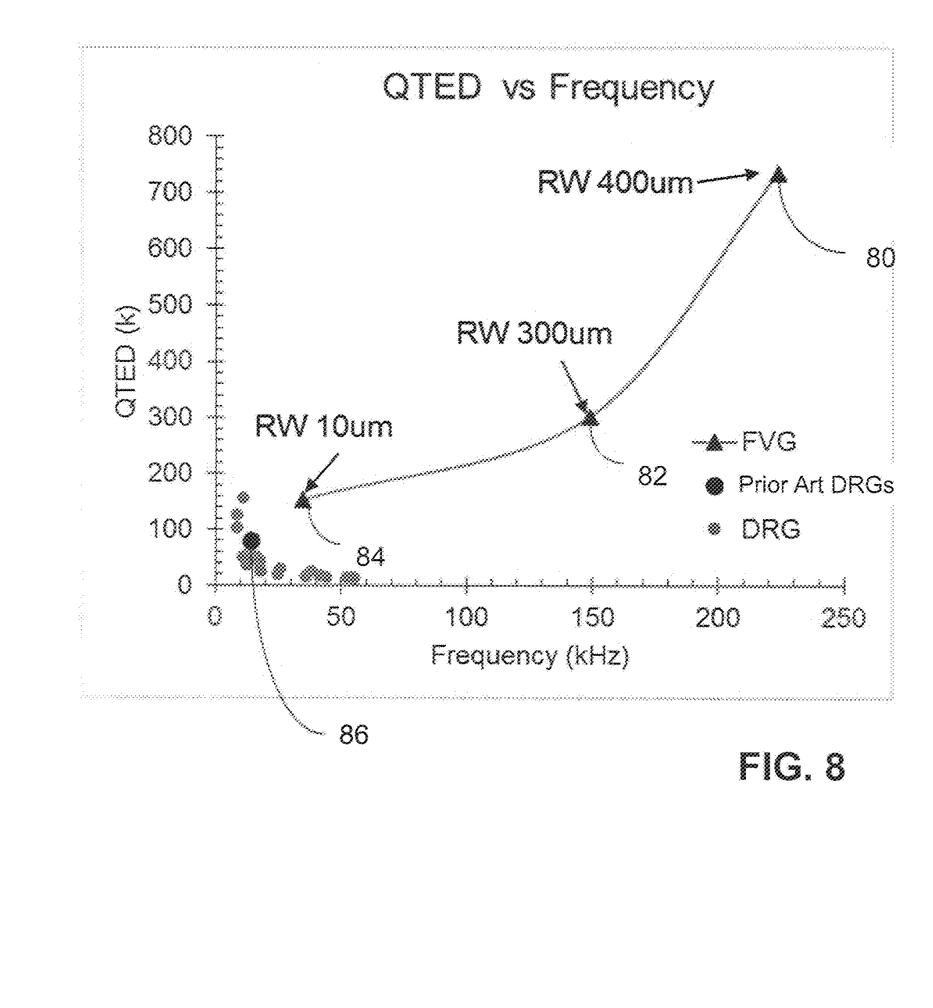
FIG. 8 shows a graph of QTED vs frequency for FVG resonator designs having different ring widths (RW) in accordance with the present disclosure.

FIG. 8 shows a graph of QTED vs frequency for FVG designs for various ring and spring widths. For the results in FIG. 8, both the springs and the outer stiffener ring are configured to have the same thickness and both are increased from 10 um to 400 um. Based on a COMSOL simulation with thermo-elastic damping, FIG. 8 shows that a high adiabatic QTED can be achieved for the FVG by increasing the width of the springs 14, for example to 300 um, without the need to add any stiffeners, other than the outside ring 16. As shown in FIG. 8, a FVG having springs 14 with a width of 400 um, as shown by triangle 80, has a higher QTED and resonance frequency than a FVG having springs 14 with a width of 300 um, as shown by triangle 82. Also, a FVG having springs 14 with a width of 300 um has a higher QTED and resonance frequency than a FVG having a springs with a width of 10 um, as shown by triangles 82 and 84, respectively. Also shown is the QTED and resonance frequency for a prior art disk resonator gyroscope (DRG), as shown by black dot 86, which has a much lower QTED and resonance frequency than that achieved by the FVG designs.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. A method of providing a resonator comprising:
providing a wafer comprising an insulator with a backside wafer on one side of the insulator and a front side wafer on another side of the insulator;
depositing and patterning a front side metal on the front side wafer;
patterning the front side wafer to expose the insulator and to form an anchor, an outer stiffener ring on an outer perimeter of the resonator, and a plurality of curved springs between the anchor and the outer stiffener ring;
removing a portion of the insulator to release a resonant portion of the resonator from the backside wafer; and
leaving the anchor of the resonator attached to the backside wafer;
the method further comprising: patterning a backside alignment target on the backside wafer; depositing and patterning a backside metal on the backside wafer for attachment to a package.

2. The method of claim 1 wherein depositing and patterning the front side metal on the front side wafer comprises: depositing metal for electrical contact to an electrode and for electrical contact to the anchor.

3. The method of claim 1: wherein the insulator is silicon dioxide (SiO.sub.2).

4. The method of claim 1 wherein: the outer stiffener ring has a first diameter; and the anchor is concentric with the outer stiffener ring and has a second diameter less than the first diameter.

5. The method of claim 1 wherein: the plurality of curved springs have a rotational symmetry about a center axis with an N fold of symmetry, where N is a positive integer.

6. The method of claim 1 further comprising: forming a plurality of electrodes outside the outer perimeter of the resonator; wherein the plurality of electrodes are not in physical contact with the outer stiffener ring; and wherein a gap is between each electrode and the outer stiffener ring.

7. The method of claim 1 wherein: the plurality of curved springs comprise a plurality of convex springs coupled to the outer stiffener ring and pointing towards the anchor.

8. The method of claim 1 wherein: the plurality of curved springs comprise a plurality of convex springs coupled to the anchor and pointing towards the outer stiffener ring.

9. The method of claim 1 wherein: the frontside wafer comprises Si, quartz, or SiC; and the backside wafer comprises Si, quartz, or SiC.

10. A method of providing a resonator comprising:
providing a wafer comprising an insulator with a backside wafer on one side of the insulator and a front side wafer on another side of the insulator;
depositing and patterning a front side metal on the front side wafer;
patterning the front side wafer to expose the insulator and to form an anchor, an outer stiffener ring on an outer perimeter of the resonator, and a plurality of curved springs between the anchor and the outer stiffener ring;
removing a portion of the insulator to release a resonant portion of the resonator from the backside wafer; and
leaving the anchor of the resonator attached to the backside wafer;
wherein patterning the front side wafer further comprises: patterning to form at least one inner stiffener ring concentric with the outer stiffener ring; wherein the plurality of curved springs are coupled to the at least one inner stiffener ring; and wherein the outer stiffener ring has a first diameter that is greater than a second diameter of the inner stiffener ring.

11. A method of providing a resonator comprising:
providing a wafer comprising an insulator with a backside wafer on one side of the insulator and a front side wafer on another side of the insulator;
depositing and patterning a front side metal on the front side wafer;
patterning the front side wafer to expose the insulator and to form an anchor, an outer stiffener ring on an outer perimeter of the resonator, and a plurality of curved springs between the anchor and the outer stiffener ring;
removing a portion of the insulator to release a resonant portion of the resonator from the backside wafer; and
leaving the anchor of the resonator attached to the backside wafer;
wherein: the plurality of curved springs comprise a first set of springs each having a clockwise curvature between the anchor and the outer stiffener ring, and a second set of curved springs each having a counterclockwise curvature between the anchor and the outer stiffener ring.

12. A method of providing a resonator comprising:
providing a wafer comprising an insulator with a backside wafer on one side of the insulator and a front side wafer on another side of the insulator;
depositing and patterning a front side metal on the front side wafer;
patterning the front side wafer to expose the insulator and to form an anchor, an outer stiffener ring on an outer perimeter of the resonator, and a plurality of curved springs between the anchor and the outer stiffener ring;
removing a portion of the insulator to release a resonant portion of the resonator from the backside wafer; and
leaving the anchor of the resonator attached to the backside wafer;
the method further comprising: patterning a plurality of inner stiffener rings each concentric with the outer stiffener ring; wherein a pitch between each adjacent inner stiffener ring, or between the outer stiffener ring and a respective inner stiffener ring adjacent to the outer stiffener ring, or between the anchor and a respective inner stiffener ring adjacent to the anchor is the same.

13. A method of providing a resonator comprising:
providing a wafer comprising an insulator with a backside wafer on one side of the insulator and a front side wafer on another side of the insulator;
depositing and patterning a front side metal on the front side wafer;
patterning the front side wafer to expose the insulator and to form an anchor, an outer stiffener ring on an outer perimeter of the resonator, and a plurality of curved springs between the anchor and the outer stiffener ring;

removing a portion of the insulator to release a resonant portion of the resonator from the backside wafer; and leaving the anchor of the resonator attached to the backside wafer;

the method further comprising: forming a plurality of internal electrodes; wherein each internal electrode is located between a curved spring and another curved spring and at least one inner stiffener ring, or between a curved spring and another curved spring and the anchor, or between a curved spring and another curved spring and the outer stiffener ring; wherein the plurality of inner electrodes are not in physical contact with the curved springs, the at least one inner stiffener ring, the anchor or the outer stiffener ring; and wherein a gap is between each inner electrode and adjacent curved springs, the at least one inner stiffener ring, the anchor and the outer stiffener ring.

* * * * *